(12) United States Patent
Chen

(10) Patent No.: US 12,412,869 B2
(45) Date of Patent: Sep. 9, 2025

(54) ELECTRONIC STRUCTURE HAVING FIRST AND SECOND THERMAL CONDUCTIVE MATERIALS COVERING CONDUCTIVE BUMPS AND MANUFACTURING METHOD THEREOF, AND ELECTRONIC PACKAGE HAVING ELECTRONIC STRUCTURE AND MANUFACTURING METHOD THEREOF

(71) Applicant: SILICONWARE PRECISION INDUSTRIES CO., LTD., Taichung (TW)

(72) Inventor: Yi-Ling Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 468 days.

(21) Appl. No.: 18/063,115

(22) Filed: Dec. 8, 2022

(65) Prior Publication Data
US 2024/0047420 A1 Feb. 8, 2024

(30) Foreign Application Priority Data
Aug. 5, 2022 (TW) ................................. 111129577

(51) Int. Cl.
*H01L 25/065* (2023.01)
*H01L 21/48* (2006.01)
*H01L 23/00* (2006.01)
*H01L 23/31* (2006.01)
*H01L 23/498* (2006.01)

(52) U.S. Cl.
CPC ........ *H01L 25/0655* (2013.01); *H01L 21/486* (2013.01); *H01L 23/3128* (2013.01); *H01L 23/49816* (2013.01); *H01L 23/49827* (2013.01); *H01L 24/73* (2013.01); *H01L 24/81* (2013.01); *H01L 2224/73204* (2013.01); *H01L 2224/81815* (2013.01)

(58) Field of Classification Search
CPC ............... H01L 25/0655; H01L 21/486; H01L 23/3128; H01L 23/49816; H01L 23/49827; H01L 24/73; H01L 24/81
See application file for complete search history.

(56) References Cited

U.S. PATENT DOCUMENTS

2021/0066179 A1* 3/2021 Li ........................ H01L 21/486
2021/0066269 A1* 3/2021 Yang .................. H01L 23/49822
2021/0082837 A1* 3/2021 Huang ................ H01L 23/5384
2022/0406697 A1* 12/2022 Kim .................... H01L 23/3128

* cited by examiner

*Primary Examiner* — Michael Jung
(74) *Attorney, Agent, or Firm* — Studebaker Brackett PLLC

(57) ABSTRACT

An electronic package and a manufacturing method thereof are provided, where the manufacturing method is to dispose an electronic structure with a plurality of conductive bumps and a thermal conductor on its upper surface on a carrier structure via external bumps on its lower surface, so that when reflowing the external bumps, the heat of the heat source joint is conducted from the upper surface of the electronic structure to the external bumps on the lower surface via the thermal conductor, so as to facilitate the heating and reflowing of the external bumps to avoid the problem of non-wetting of the solder.

24 Claims, 7 Drawing Sheets

ELECTRONIC STRUCTURE HAVING FIRST AND SECOND THERMAL CONDUCTIVE MATERIALS COVERING CONDUCTIVE BUMPS AND MANUFACTURING METHOD THEREOF, AND ELECTRONIC PACKAGE HAVING ELECTRONIC STRUCTURE AND MANUFACTURING METHOD THEREOF

BACKGROUND

1. Technical Field

The present disclosure relates to a semiconductor device, and more particularly, to an electronic package with through-silicon via (TSV) elements and a manufacturing method thereof.

2. Description of Related Art

In order to ensure the continued miniaturization and multi-functionality of electronic products and communication equipment, semiconductor packaging needs to develop towards miniaturization in order to facilitate the connection of multiple pins. To this end, the industry has developed many advanced packaging process technologies. For example, in advanced packaging process, commonly used packaging types include 2.5D packaging process, fan-out embedded bridge (FO-EB) process, etc.

FIG. 1 is a schematic cross-sectional view showing a manufacturing method of a conventional semiconductor package. As shown in FIG. 1, in the manufacturing method of the conventional semiconductor package, an electronic structure 1a having at least one conductive TSV 110 is disposed on a routing structure 14 on a carrier board 1b, wherein a redistribution layer (RDL) 12 electrically connected to the conductive TSV 110 is formed on the surface of a silicon plate body 11 of the electronic structure 1a. The RDL 12 includes a dielectric layer 120 and a circuit layer 121 formed on the dielectric layer 120, and the circuit layer 121 is electrically connected to the conductive TSV 110. Further, a solder mask layer 13 is formed on the RDL 12, and parts of the circuit layer 121 are exposed from the solder mask layer 13 to bond to a plurality of conductive bumps 161.

Furthermore, another solder mask layer 15 may be formed on the silicon plate body 11, wherein end surfaces of the conductive TSVs 110 are exposed from the solder mask layer 15 to bond to a plurality of solder bumps 122, and the solder bumps 122 are electrically connected to the conductive TSVs 110 and electrical contact pads 140 of the routing structure 14, wherein an under bump metallurgy (UBM) layer 17 for connecting the solder bumps 122 can be selectively formed on the end surfaces of the conductive TSVs 110.

In addition, in the electronic structure 1a, the plurality of conductive bumps 161 are covered by a protective film 10.

In the manufacturing method of the conventional semiconductor package, when the electronic structure 1a is bonded to the routing structure 14, the solder bumps 122 need to be heated and reflowed. However, during the heating process, a heat source Q provided by a heat source joint 8 of a reflow equipment is deposited on the upper protective film 10 and cannot be effectively transferred to the lower solder bumps 122, thereby causing the problem of non-wetting of the solder bumps 122.

Therefore, how to overcome the above-mentioned drawbacks of the prior art has become an urgent issue to be solved at present.

SUMMARY

In view of the various deficiencies of the prior art, the present disclosure provides an electronic structure, comprising: an electronic body being a semiconductor substrate and having a first surface and a second surface opposing the first surface; a plurality of conductive bumps disposed on the first surface of the electronic body; and a thermal conductor disposed on the first surface of the electronic body and including a first thermal conductive material contacting peripheral surfaces of the plurality of conductive bumps to cover the plurality of conductive bumps, and a second thermal conductive material adjacent to the first thermal conductive material, wherein a thermal conductivity of the second thermal conductive material is greater than a thermal conductivity of the first thermal conductive material.

The present disclosure also provides a method of manufacturing an electronic structure, comprising: providing a semiconductor substrate as an electronic body, wherein the electronic body has a first surface and a second surface opposing the first surface; forming a plurality of conductive bumps on the first surface of the electronic body; forming a first thermal conductive material on a partial region of the first surface of the electronic body, wherein the first thermal conductive material covers the plurality of conductive bumps, and another partial region of the first surface of the electronic body is exposed from the first thermal conductive material; and forming a second thermal conductive material adjacent to the first thermal conductive material on the another partial region of the first surface of the electronic body, wherein the first thermal conductive material and the second thermal conductive material serve as a thermal conductor, wherein a thermal conductivity of the second thermal conductive material is greater than a thermal conductivity of the first thermal conductive material.

In the aforementioned electronic structure and method, a Young's modulus of the first thermal conductive material is less than a Young's modulus of the second thermal conductive material.

In the aforementioned electronic structure and method, a thickness of the first thermal conductive material relative to a peripheral surface of the conductive bump is at least 5 micrometers.

In the aforementioned electronic structure and method, the first thermal conductive material and the conductive bumps are disposed on the first surface of the electronic body in concentric circles.

In the aforementioned electronic structure and method, a ratio of a layout area of the second thermal conductive material on the first surface to a layout area of the first thermal conductive material on the first surface is greater than or equal to 70%.

The present disclosure further provides an electronic package, comprising: a circuit structure having a first side and a second side opposing the first side; the aforementioned electronic structure disposed on the first side of the circuit structure with the first surface of the electronic body; and a plurality of electronic elements disposed on the second side of the circuit structure and electrically connected to the circuit structure, wherein the electronic structure is electrically connected to the circuit structure via the plurality of conductive bumps to electrically bridge at least two of the plurality of electronic elements.

The present disclosure yet provides a method of manufacturing an electronic package, comprising: providing the aforementioned electronic structure and a circuit structure, wherein the circuit structure has a first side and a second side opposing the first side; disposing the electronic structure on the first side of the circuit structure with the first surface of the electronic body; and disposing a plurality of electronic elements on the second side of the circuit structure, wherein the plurality of electronic elements are electrically connected to the circuit structure, wherein the electronic structure is electrically connected to the circuit structure via the plurality of conductive bumps to electrically bridge at least two of the plurality of electronic elements.

In the aforementioned electronic package and method, the present disclosure further comprises forming a cladding layer covering the electronic structure.

In the aforementioned electronic package and method, the present disclosure further comprises forming a packaging layer covering the plurality of electronic elements.

In the aforementioned electronic package and method, the present disclosure further comprises disposing the electronic structure on a carrier structure with the second surface of the electronic body, wherein the electronic structure is electrically connected to the carrier structure. For example, the electronic structure is mounted to the carrier structure via a plurality of external bumps with the second surface of the electronic body. Alternatively, the present disclosure may comprise forming a plurality of conductive pillars on the carrier structure to electrically connect the carrier structure.

Further, the plurality of conductive pillars surround the electronic structure.

As can be seen from the above, in the electronic package and its manufacturing method and electronic structure and its manufacturing method of the present disclosure, the plurality of conductive bumps are covered by the thermal conductor, so that the second thermal conductive material with higher thermal conductivity can improve the thermal conduction efficiency of the electronic structure, so as to avoid the problem of non-wetting of the solder on the external bumps.

Furthermore, by surrounding and covering the conductive bumps with the first thermal conductive material of softer material, the function of buffering and protecting the conductive bumps can be achieved.

BRIEF DESCRIPTION OF THE DRAWINGS

FIG. 2A to FIG. 2C-1 are schematic cross-sectional views illustrating a method for manufacturing an electronic structure according to the present disclosure.

FIG. 2C-2 is a schematic top plan view of FIG. 2C-1.

FIG. 2C-3 is a schematic top plan view showing another aspect of FIG. 2C-2.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "above," "upper," "first," "second," "one," "a," "an" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2C-1 are schematic cross-sectional views illustrating a method for manufacturing an electronic structure 2a according to the present disclosure.

Figure 2A:
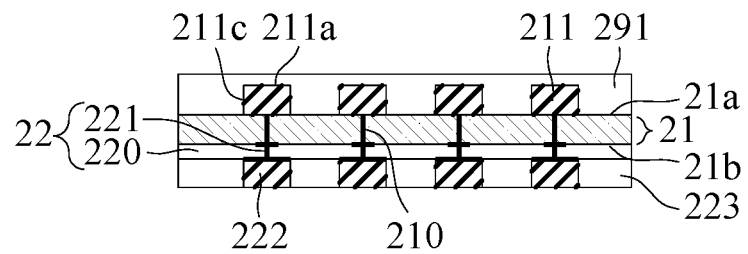

As shown in FIG. 2A, a semiconductor substrate is provided as an electronic body 21, which has a first surface 21a and a second surface 21b opposite to each other, and then a plurality of conductive bumps 211 are formed on the first surface 21a of the electronic body 21. Next, a first thermal conductive material 291 is formed on the first surface 21a of the electronic body 21, so that the first thermal conductive material 291 covers the plurality of conductive bumps 211.

In an embodiment, the electronic body 21 is a semiconductor chip, inside which a plurality of conductive vias 210 connected to the first surface 21a and the second surface 21b are formed, so that the conductive vias 210 are electrically connected to the plurality of conductive bumps 211. For example, the conductive via 210 is a conductive through-silicon via (TSV), and a circuit portion 22 can be formed on the first surface 21a and/or the second surface 21b of the electronic body 21 according to requirements (in the embodiment, the circuit portion 22 is formed on the second surface 21b), wherein the circuit portion 22 includes at least one insulating layer 220 and at least one conductive trace 221 bonded to the insulating layer 220, so that the conductive trace 221 is electrically connected to the conductive via 210. It should be understood that there are various aspects related to the semiconductor device having the conductive via 210, and the present disclosure is not limited to as such.

Furthermore, the conductive bumps 211 are metal pillars such as copper pillars, so that the first thermal conductive material 291 contacts peripheral surfaces 211c and an end surface 211a of each of the conductive bumps 211.

Also, the first thermal conductive material 291 is a dielectric material such as polybenzoxazole (PBO), polyimide (PI), prepreg (PP), or the like.

In addition, a plurality of external bumps 222 may be formed on the second surface 21b of the electronic body 21 (or the circuit portion 22) according to requirements. For example, the external bumps 222 include copper bumps, and the external bumps 222 are electrically connected to the conductive vias 210 (or the conductive traces 221), and a non-conductive film (NCF) can be used as a bonding layer 223 to cover the external bumps 222 according to requirements. It should be understood that there are various aspects related to the external bumps 222, and the present disclosure is not limited to as such.

Figure 2B:
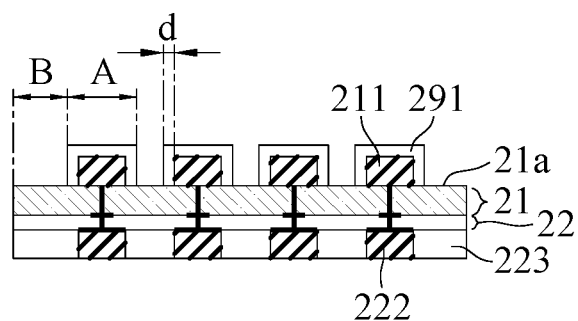

As shown in FIG. 2B, a patterning process is performed to remove partial materials of the first thermal conductive material 291, so that the first thermal conductive material 291 is only formed on a partial region A of the first surface 21a of the electronic body 21, such that another partial region B of the first surface 21a of the electronic body 21 is exposed from the first thermally conductive material 291.

Figures 1, 2C:
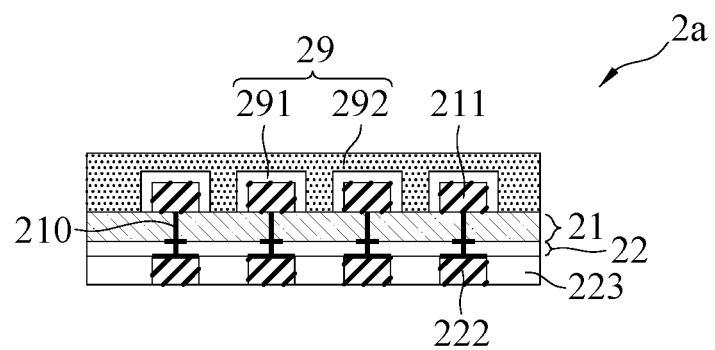
Figures 2, 2C:
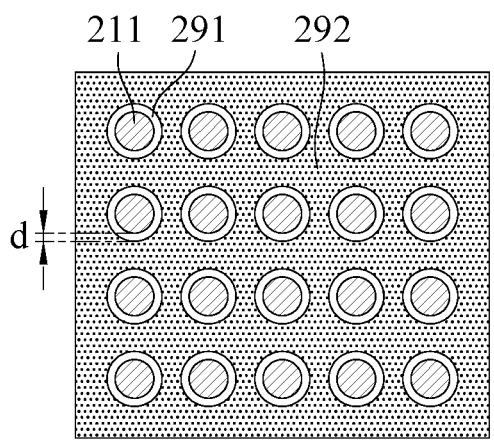

In an embodiment, a remaining thickness d of the first thermal conductive material 291 relative to the peripheral surface of the conductive bump 211 is at least 5 micrometers, and the first thermal conductive material 291 and the conductive bumps 211 are arranged in concentric circles on the first surface 21a of the electronic body 21, as shown in FIG. 2C-2.

Figure 1:
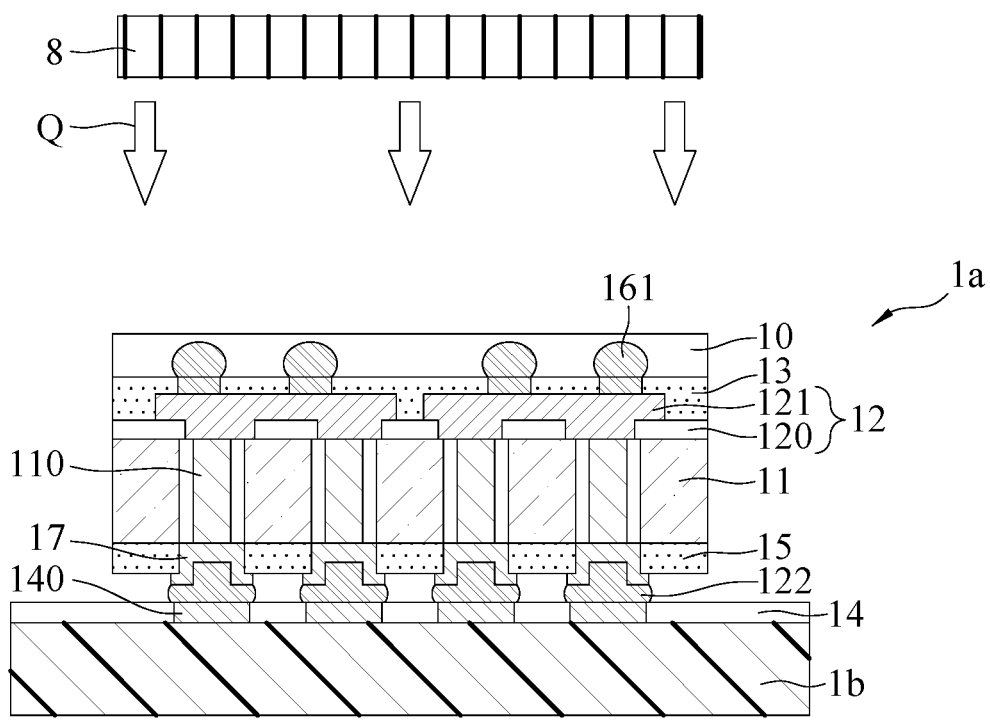
FIG. 1 is a schematic cross-sectional view of a conventional semiconductor package.

As shown in FIG. 2C-1, a second thermal conductive material 292 adjacent to the first thermal conductive material 291 is formed on the first surface 21a of the electronic body 21, and the first thermal conductive material 291 and the second thermal conductive material 292 are used as a thermal conductor 29 to form the electronic structure 2a according to the present disclosure, wherein the thermal conductor 29 is a composite insulating layer, and a thermal conductivity of the second thermal conductive material 292 is greater than a thermal conductivity of the first thermal conductive material 291.

In an embodiment, a nitride such as silicon nitride (SiN) or other insulating material is used as the second thermal conductive material 292 to fill up the partial region B of the first surface 21a. For example, the thermal conductivity of the first thermal conductive material 291 is less than 1 W/mK (e.g., PI material), and the thermal conductivity of the second thermal conductive material 292 is 25 W/mK (e.g., SiN material).

Furthermore, a Young's modulus of the first thermal conductive material 291 is less than a Young's modulus of the second thermal conductive material 292, so that the first thermal conductive material 291 is relatively soft and is regarded as a soft material, and the second thermal conductive material 292 is relatively hard and is regarded as a hard material. For example, the Young's modulus of the first thermal conductive material 291 is 3.3 GPa (e.g., PI material), and the Young's modulus of the second thermal conductive material 292 is 265 GPa (e.g., SiN material).

Figures 2, 2C, 3:
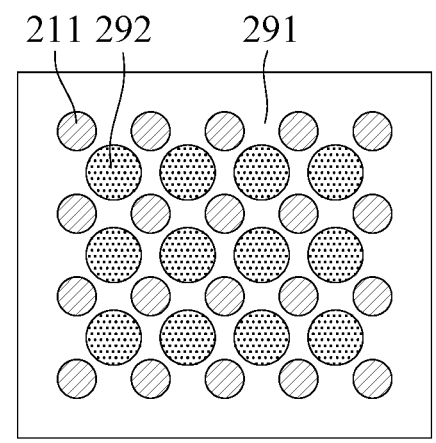

In addition, although the higher the proportion of the second thermal conductive material 292 is, the better the overall thermal conduction effect will be, but because the peripheral surface 211c of the conductive bump 211 needs to be covered with a thin film such as the first thermal conductive material 291, the thickness d of the first thermal conductive material 291 is at least 5 micrometers to achieve the effect of protecting the conductive bump 211, so the ratio of the arrangement/layout area of the second thermal conductive material 292 on the first surface 21a to the arrangement/layout area of the first thermal conductive material 291 on the first surface 21a is preferably greater than or equal to 70% (i.e., ≥0.7). For instance, as shown in FIG. 2C-2, when the material of the first thermal conductive material 291 is sufficiently removed in the patterning process of FIG. 2B so that the first thermal conductive material 291 only surrounds the conductive bump 211 with a thickness of 5 micrometers, the layout area of the second thermal conductive material 292 on the first surface 21a is maximized; alternatively, as shown in FIG. 2C-3, when the material of the first thermal conductive material 291 is not sufficiently removed by the patterning process of FIG. 2B so that only the first surface 21a between the conductive bumps 211 is exposed from the first thermal conductive material 291, the layout area of the second thermal conductive material 292 on the first surface 21a is minimized.

Figure 2D:
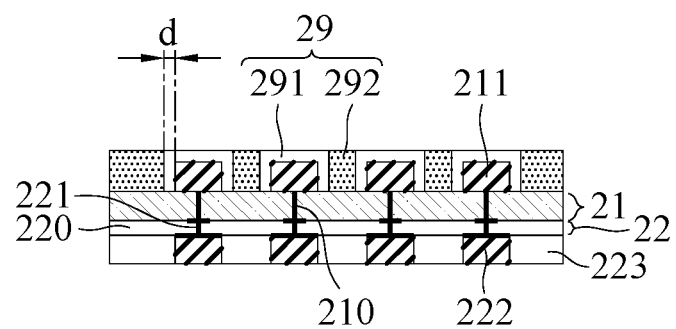
FIG. 2D is a schematic cross-sectional view showing another aspect of FIG. 2C-1.

In addition, the second thermal conductive material 292 covers the first thermal conductive material 291 to improve thermal conduction efficiency. Alternatively, in another embodiment as shown in FIG. 2D, the second thermal conductive material 292 is free from covering the first thermal conductive material 291, and the thermal conductivity of the second thermal conductive material 292 shown in FIG. 2D is less than the thermal conductivity of the second thermal conductive material 292 shown in FIG. 2C-1.

FIG. 3A to FIG. 3F are schematic cross-sectional views illustrating a method for manufacturing an electronic package 2 according to the present disclosure. In an embodiment, the electronic structure 2a shown in FIG. 2C-1 is adopted.

Figure 3A:
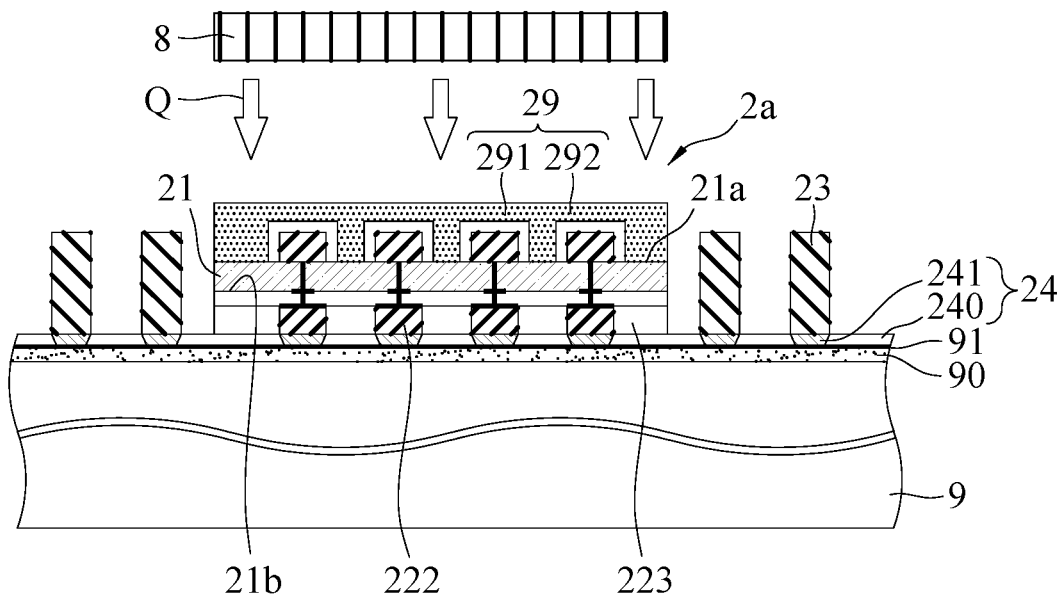
FIG. 3A to FIG. 3F are schematic cross-sectional views illustrating a method for manufacturing an electronic package according to the present disclosure.

As shown in FIG. 3A, a carrier 9 is provided, and at least one electronic structure 2a and a plurality of conductive pillars 23 are disposed on the carrier 9.

The carrier 9 is, for example, a plate made of semiconductor material (such as silicon or glass), on which a release layer 90 and a metal layer 91 such as titanium/copper are sequentially formed by, for example, coating, so that a carrier structure 24 is formed on the metal layer 91, wherein the electronic structure 2a is disposed on the carrier structure 24 with the second surface 21b of the electronic body 21 facing the carrier 9.

In an embodiment, the carrier structure 24 is, for example, a package substrate with a core layer or a coreless package substrate, and the carrier structure 24 includes at least one dielectric layer 240 and a circuit layer 241 bonded to the dielectric layer 240. For example, the material for forming the dielectric layer 240 is a dielectric material such as polybenzoxazole (PBO), polyimide (PI), prepreg (PP), or the like, and the circuit layer 241 and the dielectric layer 240 may be formed by a redistribution layer (RDL) process.

The electronic structure 2a is disposed on the circuit layer 241 of the carrier structure 24 via the plurality of external bumps 222 with the second surface 21b of the electronic body 21.

In an embodiment, the electronic structure 2a is fixed on the carrier structure 24 by reflowing the external bumps 222, wherein the heat source Q provided by the heat source joint 8 of the reflow equipment can be conducted from the first surface 21a of the electronic body 21 to the external bumps 222 by utilizing the high thermal conductivity of the second thermal conductive material 292, so as to facilitate the heating and reflow of the external bumps 222, thereby avoiding the problem of non-wetting of the solder.

Furthermore, if the non-conductive film (NCF) as the bonding layer 223 is not prepared first when the electronic structure 2a is fabricated, then a bonding layer 223 made of underfill or other materials that are easy to adhere to the dielectric layer 240 may be used to cover the external bumps 222 after the electronic structure 2a is disposed on the carrier structure 24.

The conductive pillars 23 are disposed on the carrier structure 24 and are electrically connected to the circuit layer 241.

In an embodiment, the material for forming the conductive pillar 23 is a metal material such as copper or a solder material. For example, the conductive pillars 23 are formed by electroplating on the circuit layer 241 by exposure and development.

Figure 3B:
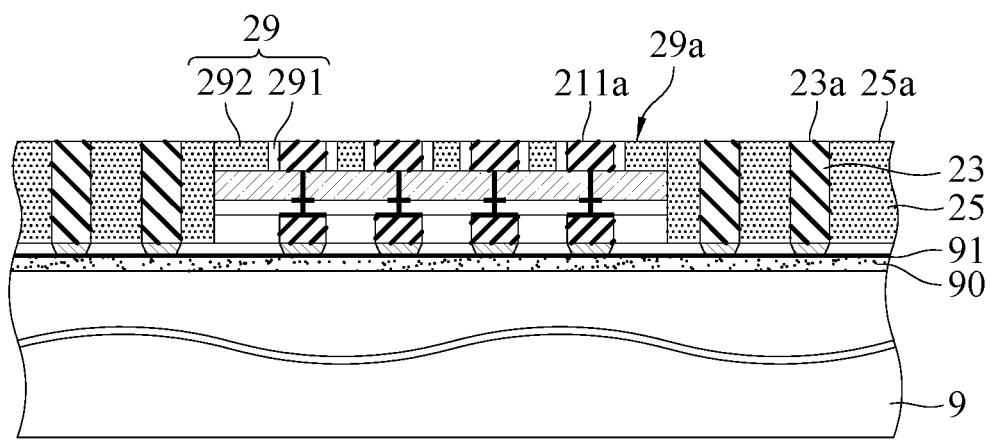

As shown in FIG. 3B, a cladding layer 25 is formed on the carrier structure 24, so that the cladding layer 25 covers the electronic structure 2a, the thermal conductor 29 and the conductive pillars 23, such that a top surface 29a of the thermal conductor 29, the end surfaces 211a of the conductive bumps 211 and end surfaces 23a of the conductive pillars 23 are exposed from a surface 25a of the cladding layer 25.

In an embodiment, the cladding layer 25 is made from an insulating material, such as polyimide (PI), dry film, encapsulating colloid such as epoxy resin, or molding compound. For example, the cladding layer 25 can be formed on the carrier structure 24 by liquid compound, injection, lamination, or compression molding.

Furthermore, the surface 25a of the cladding layer 25 can be flush with the top surface 29a of the thermal conductor 29, the end surfaces 23a of the conductive pillars 23 and the end surfaces 211a of the conductive bumps 211 by a leveling process, so that the end surfaces 23a of the conductive pillars 23 and the end surfaces 211a of the conductive bumps 211 are exposed from the surface 25a of the cladding layer 25. For example, the leveling process removes partial materials of the thermal conductor 29, partial materials of the conductive pillars 23, partial materials of the conductive bumps 211 and partial materials of the cladding layer 25 by grinding.

Figure 3C:
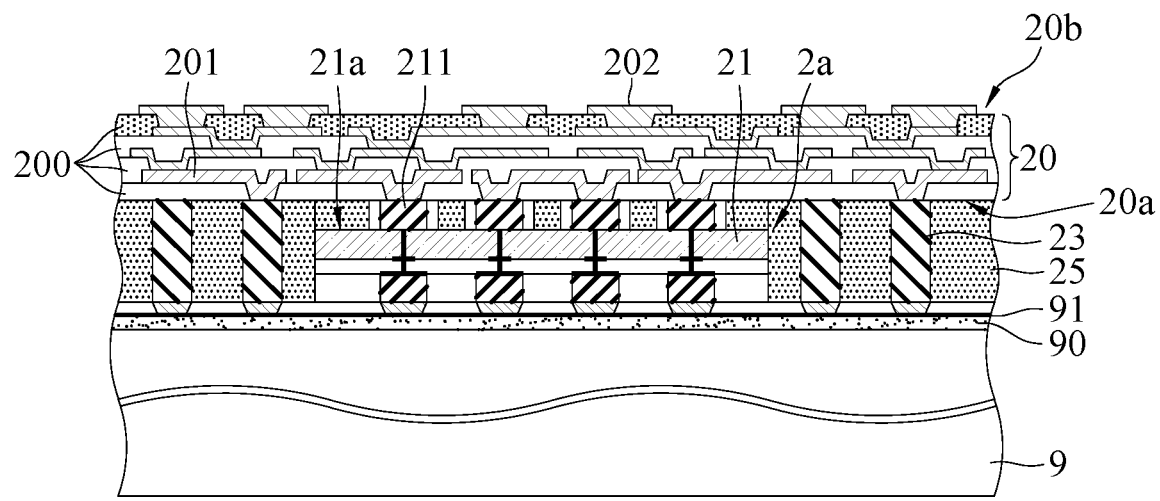

As shown in FIG. 3C, a circuit structure 20 is formed on the cladding layer 25, so that the circuit structure 20 is electrically connected to the plurality of conductive pillars 23 and the plurality of conductive bumps 211, wherein the circuit structure 20 has a first side 20a and a second side 20b opposite to each other, so that the electronic structure 2a is disposed on the first side 20a of the circuit structure 20 with the first surface 21a of the electronic body 21.

In an embodiment, the circuit structure 20 includes at least one insulating layer 200 and at least one redistribution layer (RDL) 201 disposed on the insulating layer 200, so that the redistribution layer 201 is electrically connected to the plurality of conductive pillars 23 and the plurality of conductive bumps 211, wherein the outermost insulating layer 200 can be used as a solder mask layer, and the outermost redistribution layer 201 is exposed from the solder mask layer to serve as an electrical contact pad 202, such as a micro pad (commonly known as μ-pad).

Furthermore, the material for forming the redistribution layer 201 is copper, and the material for forming the insulating layer 200 is a dielectric material such as polybenzoxazole (PBO), polyimide (PI), prepreg (PP), etc., or a solder resist material such as solder mask, graphite (e.g., ink), etc.

Figure 3D:
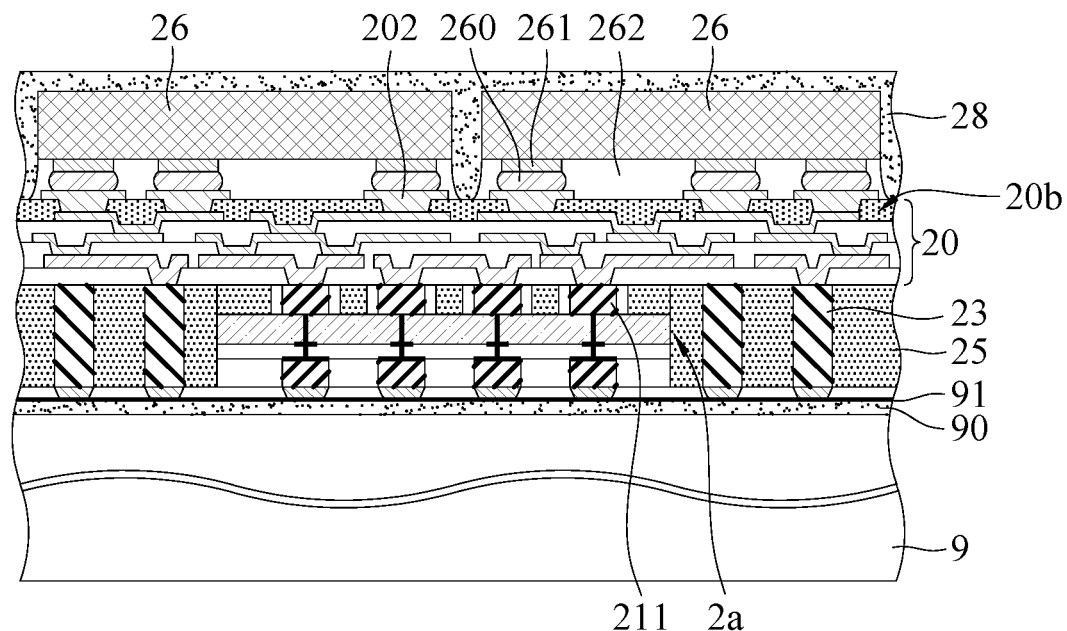

As shown in FIG. 3D, a plurality of electronic elements 26 are disposed on the second side 20b of the circuit structure 20, and a packaging layer 28 is formed to cover the electronic elements 26.

In an embodiment, the electronic element 26 is an active element, a passive element, or a combination of the active element and the passive element, where the active element is such as a semiconductor chip, and the passive element is such as a resistor, a capacitor, or an inductor. In one embodiment, the electronic element 26 is, for example, a semiconductor chip such as a graphics processing unit (GPU), a high bandwidth memory (HBM), etc., and the electronic structure 2a is used as a bridge die, which is electrically connected to the circuit structure 20 via the conductive bumps 211, thereby electrically bridging at least two electronic elements 26.

Furthermore, the electronic element 26 has a plurality of conductive bumps 261 such as copper pillars for electrically connecting the electrical contact pads 202 via a plurality of solder materials 260 such as solder bumps. In an embodiment, a UBM layer (not shown) can be formed on the electrical contact pads 202 or the electronic element 26 to facilitate the bonding of the solder materials 260 or the conductive bumps 261.

In addition, the packaging layer 28 is made from an insulating material, such as polyimide (PI), dry film, encapsulating colloid such as epoxy resin, or molding compound, which can be formed on the circuit structure 20 by lamination or molding. It should be understood that the material for forming the packaging layer 28 may be the same as or different from the material of the cladding layer 25.

In addition, an underfill 262 can be first formed between the electronic element 26 and the circuit structure 20 to cover the conductive bumps 261 and the solder material 260, and then the packaging layer 28 can be formed to cover the underfill 262 and the electronic element 26. Alternatively, in other embodiments, the packaging layer 28 can cover the electronic elements 26 and the conductive bumps 261 at the same time without forming the underfill 262.

Figure 3E:
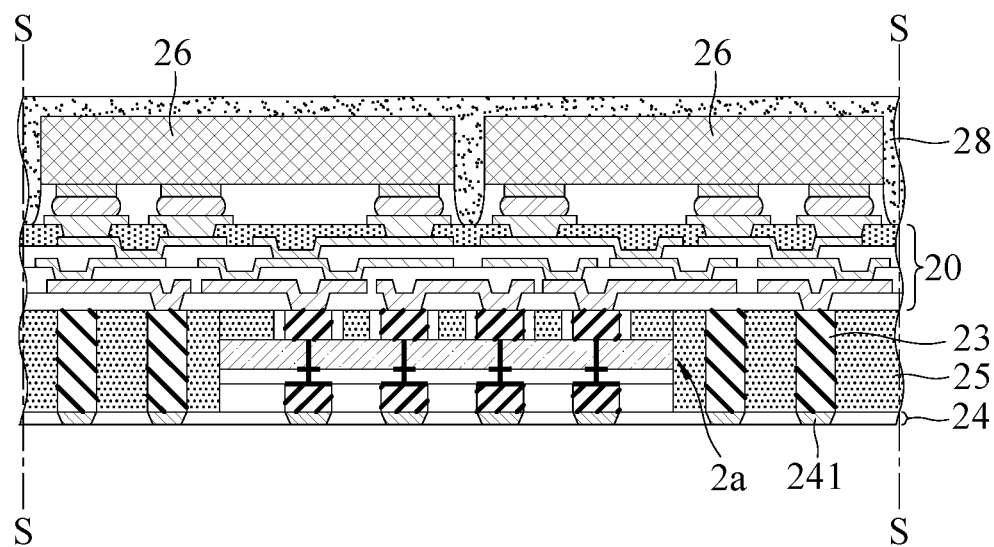

As shown in FIG. 3E, the carrier 9 and the release layer 90 thereon are removed, and then the metal layer 91 is removed to expose the carrier structure 24.

In an embodiment, when the release layer 90 is peeled off, the metal layer 91 is used as a barrier to avoid damage to the dielectric layer 240 of the carrier structure 24, so that after removing the carrier 9 and the release layer 90 thereon, the metal layer 91 is removed by etching to expose the circuit layer 241.

Figure 3F:
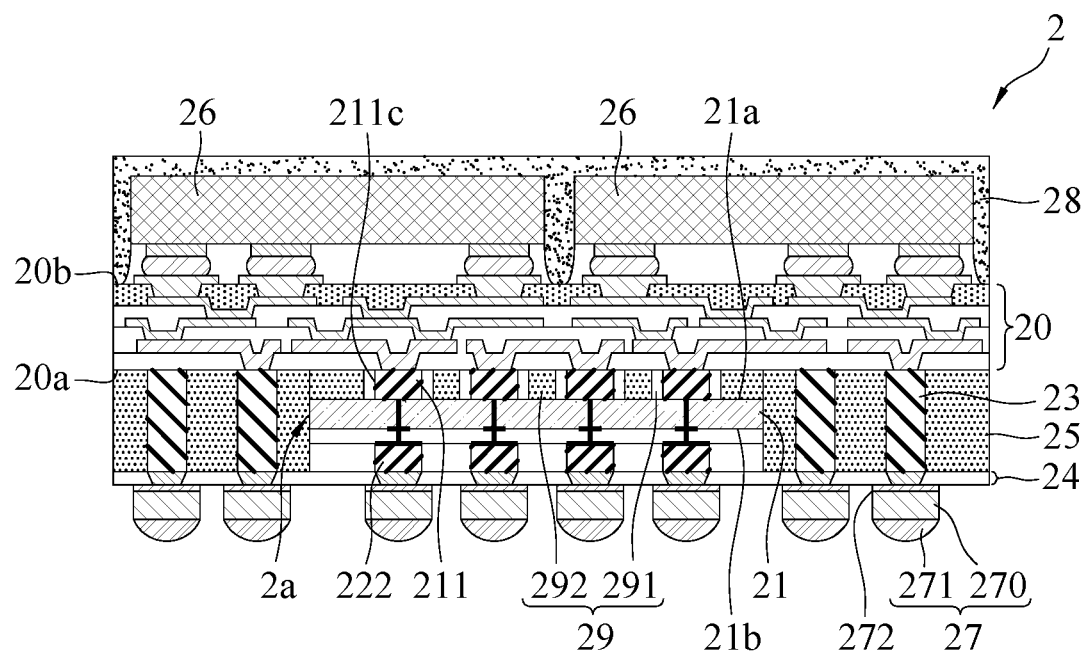

As shown in FIG. 3F, the singulation process is performed along the cutting path S shown in FIG. 3E, and a plurality of conductive elements 27 are formed on the carrier structure 24, so that the conductive elements 27 are electrically connected to the circuit layer 241 to obtain the electronic package 2.

In an embodiment, the conductive element 27 includes a metal bump 270 such as copper and a solder material 271 formed on the metal bump 270. For example, a UBM layer 272 may be formed on the circuit layer 241 to facilitate the bonding of the metal bump 270. It should be understood that when the number of the contacts (IOs) is insufficient, the RDL process can still be used to perform build-up layer operations to reconfigure the number and positions of the IOs of the carrier structure 24.

Figure 3G:
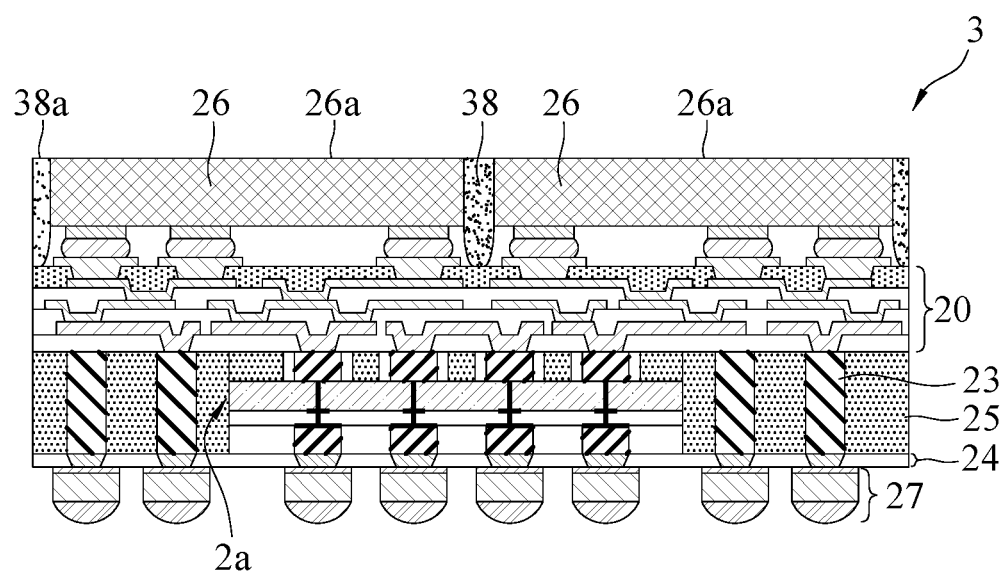
FIG. 3G is a schematic cross-sectional view showing another aspect of FIG. 3F.

Furthermore, as shown in FIG. 3G, partial materials of a packaging layer 38 can be removed by a leveling process, such as grinding, so that a top surface 38a of the packaging layer 38 is flush with a top surface 26a of the electronic element 26, such that the electronic element 26 is exposed from the packaging layer 28, so as to obtain an electronic package 3.

Furthermore, the electronic package 2 can be disposed on an electronic device (not shown) such as a package substrate or a circuit board by means of the conductive elements 27.

Therefore, in the manufacturing method of the present disclosure, the plurality of conductive bumps 211 are covered by the thermal conductor 29, so that the second thermal conductive material 292 with higher thermal conductivity can improve the thermal conduction efficiency of the electronic structure 2a, so as to avoid the problem of non-wetting of the solder on the external bumps 222.

Furthermore, the conductive bump 211 is surrounded and covered by the first thermal conductive material 291 of a relatively soft material to achieve the effect of buffer protection. Therefore, during the leveling process as shown in FIG. 3B, various problems of uneven interface stress caused by the grinding process can be alleviated by grinding the first thermal conductive material 291 (buffer material).

Figure 4:
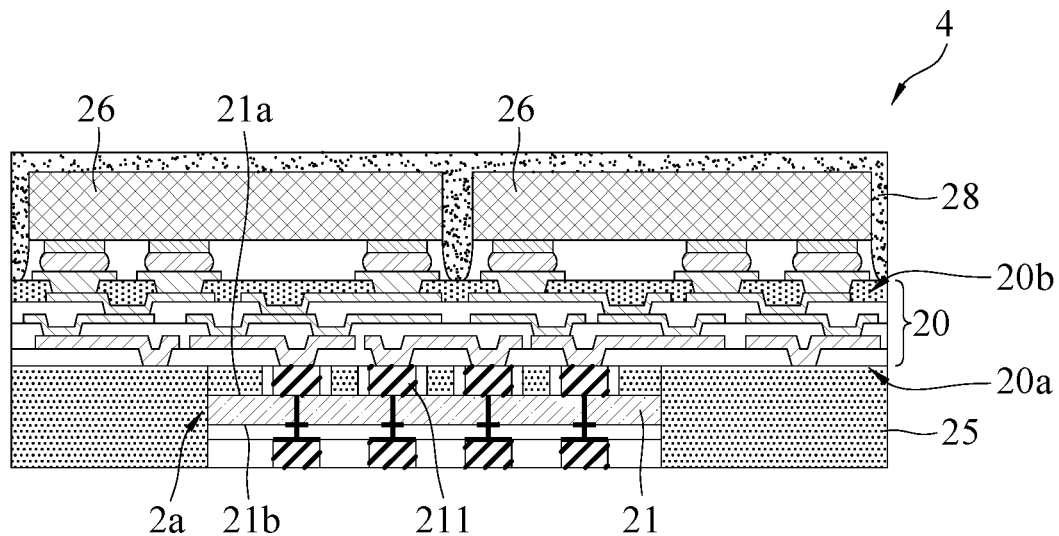
FIG. 4 is a schematic cross-sectional view of the electronic package according to another embodiment of the present disclosure.

In addition, please refer to FIG. 4, the electronic structure 2a can also be disposed on one side of the circuit structure 20, and the plurality of electronic elements 26 are disposed on the other side of the circuit structure 20 to obtain an electronic package 4.

The present disclosure provides an electronic package 2, 3, 4, comprising: an electronic structure 2a, a plurality of electronic elements 26 and a circuit structure 20, wherein the electronic structure 2a includes an electronic body 21, a plurality of conductive bumps 211 and a thermal conductor 29.

The electronic body 21 is a semiconductor substrate, which has a first surface 21a and a second surface 21b opposite to each other.

The conductive bumps 211 are disposed on the first surface 21a of the electronic body 21.

The thermal conductor 29 is disposed on the first surface 21a of the electronic body 21 and includes a first thermal conductive material 291 contacting the peripheral surfaces 211c of the plurality of conductive bumps 211 to cover the plurality of conductive bumps 211, and a second thermal conductive material 292 adjacent to the first thermal conductive material 291, wherein a thermal conductivity of the second thermal conductive material 292 is greater than a thermal conductivity of the first thermal conductive material 291.

In one embodiment, a Young's modulus of the first thermal conductive material 291 is less than a Young's modulus of the second thermal conductive material 292.

In one embodiment, a thickness d of the first thermal conductive material 291 relative to the peripheral surface of the conductive bump 211 is at least 5 micrometers.

In one embodiment, the first thermal conductive material 291 and the conductive bumps 211 are disposed on the first surface 21a of the electronic body 21 in concentric circles.

In one embodiment, a ratio of a layout area of the second thermal conductive material 292 on the first surface 21a to a layout area of the first thermal conductive material 291 on the first surface 21a is greater than or equal to 70%.

In one embodiment, the electronic package 2, 3 further includes a carrier structure 24, which carries the electronic structure 2a, so that the electronic structure 2a is disposed on the carrier structure 24 with the second surface 21b of the electronic body 21, such that the electronic structure 2a is electrically connected to the carrier structure 24.

Further, the electronic structure 2a is mounted to the carrier structure 24 via a plurality of external bumps 222 with the second surface 21b of the electronic body 21.

Alternatively, the electronic package 2, 3 further includes a plurality of conductive pillars 23 disposed on the carrier structure 24 to electrically connect the carrier structure 24. For example, the plurality of conductive pillars 23 surround the electronic structure 2a.

The circuit structure 20 has a first side 20a and a second side 20b opposite to each other.

The electronic structure 2a is disposed on the first side 20a of the circuit structure 20 with the first surface 21a of the electronic body 21.

The electronic elements 26 are disposed on the second side 20b of the circuit structure 20 to electrically connect the circuit structure 20, wherein the electronic structure 2a is electrically connected to the circuit structure 20 via the plurality of conductive bumps 211 to electrically bridge at least two of the plurality of electronic elements 26.

In one embodiment, the electronic package 2, 3, 4 further includes a cladding layer 25 covering the electronic structure 2a.

In one embodiment, the electronic package 2, 3, 4 further includes a packaging layer 28, 38 covering the plurality of electronic elements 26.

To sum up, the electronic package and the manufacturing method thereof of the present disclosure can not only achieve the function of buffer protection, but also improve the thermal conduction efficiency of the electronic structure via the design of the thermal conductor. Therefore, the present disclosure can improve the yield of products.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic structure, comprising:
   an electronic body being a semiconductor substrate and having a first surface and a second surface opposing the first surface;
   a plurality of conductive bumps disposed on the first surface of the electronic body; and
   a thermal conductor disposed on the first surface of the electronic body and including a first thermal conductive material contacting peripheral surfaces of the plurality of conductive bumps to cover the plurality of conductive bumps, and a second thermal conductive material adjacent to the first thermal conductive material, wherein the second thermal conductive material is separated from the plurality of conductive bumps by the first thermal conductive material, wherein a thermal conductivity of the second thermal conductive material is greater than a thermal conductivity of the first thermal conductive material.

2. The electronic structure of claim 1, wherein a Young's modulus of the first thermal conductive material is less than a Young's modulus of the second thermal conductive material.

3. The electronic structure of claim 1, wherein a thickness of the first thermal conductive material relative to the peripheral surface of the conductive bump is at least 5 micrometers.

4. The electronic structure of claim 1, wherein the first thermal conductive material and the conductive bumps are disposed on the first surface of the electronic body in concentric circles.

5. The electronic structure of claim 1, wherein a ratio of a layout area of the second thermal conductive material on the first surface to a layout area of the first thermal conductive material on the first surface is greater than or equal to 70%.

6. An electronic package, comprising:
   a circuit structure having a first side and a second side opposing the first side;
   the electronic structure of claim 1 disposed on the first side of the circuit structure with the first surface of the electronic body; and
   a plurality of electronic elements disposed on the second side of the circuit structure and electrically connected to the circuit structure, wherein the electronic structure is electrically connected to the circuit structure via the plurality of conductive bumps to electrically bridge at least two of the plurality of electronic elements.

7. The electronic package of claim 6, further comprising a cladding layer covering the electronic structure.

8. The electronic package of claim 6, further comprising a packaging layer covering the plurality of electronic elements.

9. The electronic package of claim 6, further comprising a carrier structure carrying the electronic structure, wherein the electronic structure is disposed on the carrier structure with the second surface of the electronic body, and the electronic structure is electrically connected to the carrier structure.

10. The electronic package of claim 9, wherein the electronic structure is mounted to the carrier structure via a plurality of external bumps with the second surface of the electronic body.

11. The electronic package of claim 9, further comprising a plurality of conductive pillars disposed on and electrically connected to the carrier structure.

12. The electronic package of claim 11, wherein the plurality of conductive pillars surround the electronic structure.

13. A method of manufacturing an electronic structure, comprising:
providing a semiconductor substrate as an electronic body, wherein the electronic body has a first surface and a second surface opposing the first surface;
forming a plurality of conductive bumps on the first surface of the electronic body;
forming a first thermal conductive material on a partial region of the first surface of the electronic body, wherein the first thermal conductive material covers the plurality of conductive bumps, and another partial region of the first surface of the electronic body is exposed from the first thermal conductive material; and
forming a second thermal conductive material adjacent to the first thermal conductive material on the another partial region of the first surface of the electronic body, wherein the first thermal conductive material and the second thermal conductive material serve as a thermal conductor, wherein the second thermal conductive material is separated from the plurality of conductive bumps by the first thermal conductive material, wherein a thermal conductivity of the second thermal conductive material is greater than a thermal conductivity of the first thermal conductive material.

14. The method of claim 13, wherein a Young's modulus of the first thermal conductive material is less than a Young's modulus of the second thermal conductive material.

15. The method of claim 13, wherein a thickness of the first thermal conductive material relative to a peripheral surface of the conductive bump is at least 5 micrometers.

16. The method of claim 13, wherein the first thermal conductive material and the conductive bumps are disposed on the first surface of the electronic body in concentric circles.

17. The method of claim 13, wherein a ratio of a layout area of the second thermal conductive material on the first surface to a layout area of the first thermal conductive material on the first surface is greater than or equal to 70%.

18. A method of manufacturing an electronic package, comprising:
providing the electronic structure of claim 1 and a circuit structure, wherein the circuit structure has a first side and a second side opposing the first side;
disposing the electronic structure on the first side of the circuit structure with the first surface of the electronic body; and
disposing a plurality of electronic elements on the second side of the circuit structure, wherein the plurality of electronic elements are electrically connected to the circuit structure, wherein the electronic structure is electrically connected to the circuit structure via the plurality of conductive bumps to electrically bridge at least two of the plurality of electronic elements.

19. The method of claim 18, further comprising forming a cladding layer covering the electronic structure.

20. The method of claim 18, further comprising forming a packaging layer covering the plurality of electronic elements.

21. The method of claim 18, further comprising disposing the electronic structure on a carrier structure with the second surface of the electronic body, wherein the electronic structure is electrically connected to the carrier structure.

22. The method of claim 21, wherein the electronic structure is mounted to the carrier structure via a plurality of external bumps with the second surface of the electronic body.

23. The method of claim 21, further comprising forming a plurality of conductive pillars on the carrier structure to electrically connect the carrier structure.

24. The method of claim 23, wherein the plurality of conductive pillars surround the electronic structure.

* * * * *